(12) United States Patent
Bentley et al.

(10) Patent No.: US 10,249,710 B2
(45) Date of Patent: Apr. 2, 2019

(54) METHODS, APPARATUS, AND SYSTEM FOR IMPROVED NANOWIRE/NANOSHEET SPACERS

(71) Applicant: GLOBALFOUNDRIES INC., Grand Cayman (KY)

(72) Inventors: Steven Bentley, Menands, NY (US); Deepak Nayak, Fremont, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 170 days.

(21) Appl. No.: 15/652,873

(22) Filed: Jul. 18, 2017

(65) Prior Publication Data

US 2017/0317169 A1 Nov. 2, 2017

Related U.S. Application Data

(62) Division of application No. 15/056,966, filed on Feb. 29, 2016, now Pat. No. 9,748,335.

(51) Int. Cl.

| | |
|---|---|
| *H01L 29/06* | (2006.01) |
| *H01L 29/78* | (2006.01) |
| *H01L 29/66* | (2006.01) |
| *H01L 21/02* | (2006.01) |
| *H01L 29/165* | (2006.01) |

(Continued)

(52) U.S. Cl.
CPC .......... *H01L 29/0673* (2013.01); *B82Y 10/00* (2013.01); *B82Y 40/00* (2013.01); *H01L 21/02236* (2013.01); *H01L 21/02532* (2013.01); *H01L 29/0653* (2013.01); *H01L 29/0665* (2013.01); *H01L 29/0847* (2013.01); *H01L 29/1037* (2013.01); *H01L 29/16* (2013.01); *H01L 29/165* (2013.01); *H01L 29/42392* (2013.01); *H01L 29/6656* (2013.01); *H01L 29/66439* (2013.01); *H01L 29/66545* (2013.01); *H01L 29/66795* (2013.01);

(Continued)

(58) Field of Classification Search
CPC ........... H01L 29/0673; H01L 29/66545; H01L 21/02236; H01L 29/6656; H01L 29/785
See application file for complete search history.

(56) References Cited

U.S. PATENT DOCUMENTS

| | | | |
|---|---|---|---|
| 9,287,135 B1 | 3/2016 | Doris | |
| 10,068,920 B2 * | 9/2018 | Reznicek | ............ H01L 27/1211 |

(Continued)

OTHER PUBLICATIONS

Office Action dated Nov. 8, 2016 in co-pending parent U.S. Appl. No. 15/056,966, filed Jan. 12, 2017.

*Primary Examiner* — Seahvosh Nikmanesh
(74) *Attorney, Agent, or Firm* — Williams Morgan, P.C.

(57) ABSTRACT

A semiconductor structure, comprising a semiconductor substrate; at least one fin, wherein the at least one fin comprises one or more first layers and one or more second layers, wherein the first layers and the second layers are interspersed and the first layers laterally extend further than the second layers; a dummy gate structure comprising a first spacer material disposed on sidewalls of the dummy gate; a second spacer material disposed adjacent to each of the second layers, wherein sidewalls of the fin comprise exposed portions of each of the first layers and the second spacer material, and an epitaxial source/drain material disposed on at least the exposed portions of each of the first layers. Methods and systems for forming the semiconductor structure.

14 Claims, 14 Drawing Sheets

(51) Int. Cl.
  *H01L 29/08* (2006.01)
  *B82Y 10/00* (2011.01)
  *B82Y 40/00* (2011.01)
  *H01L 29/423* (2006.01)
  *H01L 29/775* (2006.01)
  *H01L 29/10* (2006.01)
  *H01L 29/16* (2006.01)

(52) U.S. Cl.
  CPC .......... *H01L 29/775* (2013.01); *H01L 29/785* (2013.01); *H01L 29/7848* (2013.01)

(56) References Cited

U.S. PATENT DOCUMENTS

| | | |
|---|---|---|
| 2003/0040157 A1 | 2/2003 | Forbes et al. |
| 2005/0145941 A1* | 7/2005 | Bedell .................. H01L 21/845 257/348 |
| 2005/0239242 A1 | 10/2005 | Zhu et al. |
| 2009/0179283 A1* | 7/2009 | Adams ............. H01L 21/82345 257/411 |
| 2013/0320455 A1 | 12/2013 | Cappellani et al. |
| 2014/0264717 A1 | 9/2014 | Shieh et al. |
| 2014/0339611 A1* | 11/2014 | Leobandung ..... H01L 29/78609 257/288 |
| 2014/0369115 A1* | 12/2014 | Kim ....................... H01L 29/78 365/182 |
| 2015/0187867 A1* | 7/2015 | Basker .................... H01L 29/06 257/401 |
| 2016/0049516 A1* | 2/2016 | Huang ................ H01L 29/7853 257/401 |
| 2016/0197075 A1 | 7/2016 | Li et al. |
| 2016/0204228 A1* | 7/2016 | Tapily ............... H01L 29/66772 438/151 |
| 2016/0358922 A1* | 12/2016 | Cheng ................ H01L 27/0924 |
| 2017/0301697 A1* | 10/2017 | Reznicek ............ H01L 27/1211 |

* cited by examiner

METHODS, APPARATUS, AND SYSTEM FOR IMPROVED NANOWIRE/NANOSHEET SPACERS

BACKGROUND OF THE INVENTION

Field of the Invention

Generally, the present disclosure relates to the manufacture of sophisticated semiconductor devices, and, more specifically, to various methods, structures, and systems for preparing semiconductor devices comprising fins with improved nanosheet spacers.

Description of the Related Art

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another. In this manner, integrated circuit chips may be fabricated.

Fin field-effect transistors (FinFET) devices have been developed to replace conventional planar bulk MOSFETs in advanced CMOS technology by improving electrostatic control of the channel. Extending the concept of the finFET to further improve electrostatics involves developing structures where the gate wraps around the complete channel to form "gate-all-around" (GAA) devices. In GAA devices, the surrounded channels may comprise wires with rectangular or circular cross section, or sheets with a rectangular cross-section, which may be termed "nanowire devices" or "nanosheet devices". To improve current density per footprint, these sheets or wires can be formed in a vertically stacked fashion, where multiple channels are formed one atop the other. Such nanowire/nanosheet devices therefore comprise multiple stacked semiconductor channel layers separated by sacrificial suspension material that is removed when performing a replacement metal gate (RMG) process in order to release the channel layers, which requires the devices to complete the majority of the FEOL flow similarly to a FinFET with sacrificial suspension layers remaining.

Nanosheet devices generally require, during intermediate processing stages, spacer formation. If the spacer is misformed, subsequent epitaxial growth of source/drain elements from semiconductor sheets may at least in part nucleate from the sacrificial suspension material instead of the semiconductor sheets. Epitaxially-grown source/drain elements resulting from nucleation from sacrificial suspension material may therefore be unintentionally etched away during the channel release process, cause undesirable shorting or the introduction of unintended leakage paths in the final device.

The present disclosure may address and/or at least reduce one or more of the problems identified above regarding the prior art and/or provide one or more of the desirable features listed above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus, and systems for fabricating a semiconductor structure, comprising a semiconductor substrate; at least one fin, wherein the at least one fin comprises one or more first layers and one or more second layers, wherein the first layers and the second layers are interspersed and the first layers laterally extend further than the second layers; a dummy gate structure comprising a first spacer material disposed on sidewalls of the dummy gate; a second spacer material disposed adjacent to each of the second layers, wherein sidewalls of the fin comprise exposed portions of each of the first layers and the second spacer material, and an epitaxial source/drain material disposed on at least the exposed portions of each of the first layers.

BRIEF DESCRIPTION OF THE DRAWINGS

The disclosure may be understood by reference to the following description taken in conjunction with the accompanying drawings, in which like reference numerals identify like elements, and in which.

Figure 1A:
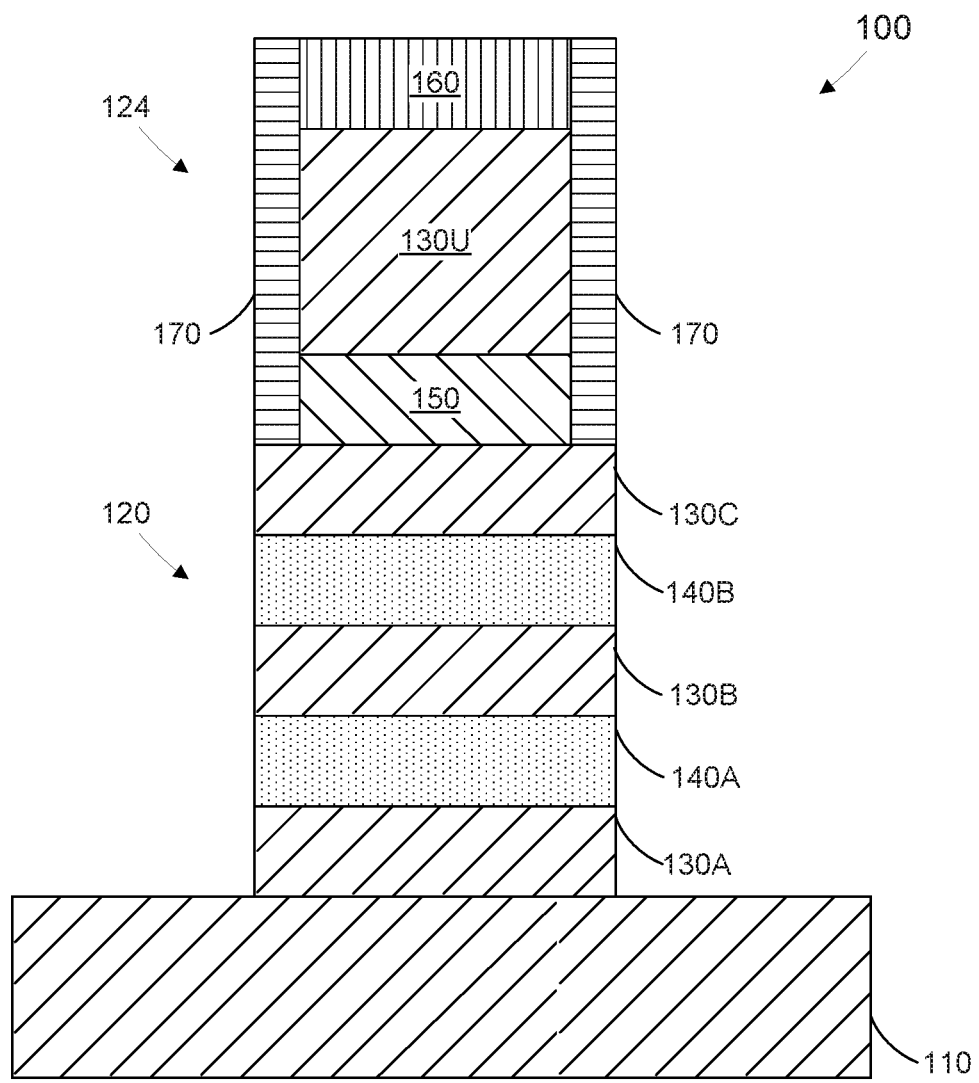
FIG. 1A illustrates a stylized cross-sectional depiction of a semiconductor device after a first stage of processing in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming nanosheet and/or nanowire devices. Embodiments herein provide form a signal spacer material resulting from forming nanosheet/nanowire devices. An oxidation-based recessing of a suspension material used for forming nanosheet/nanowire devices is performed. Embodiments provide for laterally recessing the suspension material and performing an anisotropic spacer etchback of the laterally recessed suspension material.

Other embodiments herein provide for forming nanosheet devices using a sacrificial spacer process. A first material may be fully removed after performing a suspension layer etchback process. The first material may be re-deposited and further etched to form spacers that are of a single material. Accordingly, these embodiments provide for a reduction of unwanted capacitance as a result of the elimination of spacers of dissimilar materials.

Embodiments herein provide for a semiconductor structure, comprising a semiconductor substrate; at least one fin, wherein the at least one fin comprises one or more first layers and one or more second layers, wherein the first layers and the second layers are interspersed and the first layers laterally extend further than the second layers; a dummy gate structure comprising a first spacer material disposed on sidewalls of the dummy gate; a second spacer material disposed adjacent to each of the second layers, wherein sidewalls of the fin comprise exposed portions of each of the first layers and the second spacer material, and an epitaxial source/drain material disposed on at least the exposed portions of each of the first layers.

Turning to FIG. 1A, a simplified view of a semiconductor structure, generally denoted by 100, obtained during an intermediate stage of semiconductor fabrication is depicted. At the stage of fabrication depicted in FIG. 1A, the semiconductor structure 100 comprises a semiconductor substrate layer 110. The semiconductor substrate layer 110 may comprise a bulk semiconductor material, for example, bulk silicon; a silicon-on-insulator (SOI) structure; or other material known to the person of ordinary skill in the art for use a semiconductor substrate.

The semiconductor structure 100 depicted in FIG. 1A also comprises at least one fin 120 comprising one or more first layers 130 and one or more second layers 140, wherein the first layers and the second layers are interspersed and each of the second layers is more susceptible to oxidation than any of the first layers. Although the depicted embodiment shows three first layers 130A, 130B, and 130C, and two first layers 140A and 140B, the person of ordinary skill in the art having the benefit of the present disclosure will through the exercise of routine skill be able to prepare a fin 120 comprising one, two, three, four, five, etc. first layers 130 and one, two, three, four, five, etc. second layers 140.

Each of the first layers may comprise any material and each of the second layers may also comprise any material, provided that each of the second layers is more susceptible to oxidation than any of the first layers. In one embodiment, each of the first layers may comprise a first material and each of the second layers may comprise a second material. In one embodiment, the first material is silicon and the second material is silicon-germanium (SiGe) having a formula $Si_xGe_{1-x}$, wherein $0 \leq x \leq 1$. In accordance with embodiments herein, x may be chosen such that $0.1 \leq x \leq 0.5$. In one embodiment, $x \neq 0.5$ (i.e., the second material comprises about 50 mol % germanium). It should be noted that both layers 130 and 140 could be SiGe as long as the selection of x permits etch selectivity, e.g., layers 130 may each comprise $Si_xGe_{1-x}$ and layers 140 may each comprise $Si_yGe_{1-y}$, wherein $y > x$.

The first layers 130 and the second layers 140 may be formed by any appropriate processes. The second layers 140 may be formed, for example, by various epitaxial growth processes such as ultra-high vacuum chemical vapor deposition (UHV-CVD), low-pressure CVD (LPCVD), reducedpressure CVD (RPCVD), rapid thermal CVD (RTCVD) and molecular beam epitaxy (MBE). In one example, the CVD-based epitaxial growth may take place at a temperature of between about 400° C. to about 1100° C., while molecular beam epitaxy may use a lower temperature. In a specific example, wherein the second layers 140 comprise SiGe, selective epitaxial growth of SiGe may be performed using halogermanes and silanes as the source gases at temperatures around 600° C.

The first layers 130 and the second layers 140 may have any desired thickness, bearing in mind considerations which will be set forth below.

As shown in FIG. 1A, the semiconductor structure 100 also comprises a dummy gate structure 124 comprising a first spacer material 170 disposed on sidewalls of the dummy gate. The first spacer material 170 may comprise any known spacer material. In one embodiment, the first spacer material comprises a low-k dielectric material.

As depicted, the dummy gate structure 124 may also comprise an oxide layer 150, which may comprise silicon oxide; a first material region 130U, which may comprise amorphous silicon; and a nitride layer 160, which may comprise silicon nitride. In other embodiments, one or more of layers/regions 130U, 150, or 160 may be omitted or replaced with other materials, and/or additional layers/regions (not shown) known to the person of ordinary skill in the art for use in dummy gate structures in FinFETs and/or FinFET processing may be included.

Figure 1B:
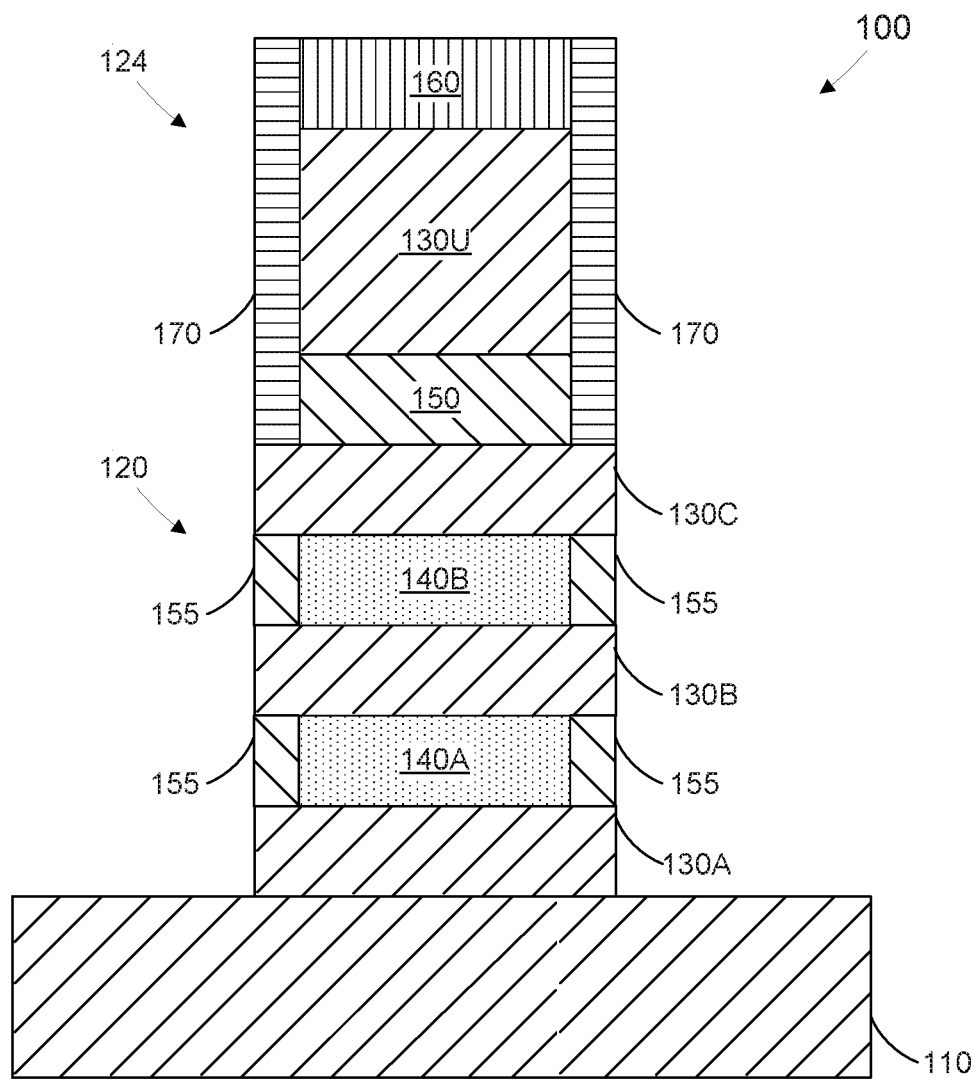
FIG. 1B illustrates a stylized cross-sectional depiction of the semiconductor device of FIG. 1A after a second stage of processing in accordance with embodiments herein.

Turning now to FIG. 1B, a stylized depiction of the semiconductor structure 100 is shown after selectively oxidizing two portions 155 of each of the second layers 140A, 140B, wherein the two portions are exposed on the sidewalls of the fin 120. The selective oxidation may be performed by any technique known in the art and which may be found by the application of routine skill to selectively oxidize the second material in preference to the first material to yield oxidized portions 155. In one example, selectively oxidizing may comprise a prolonged annealing process in the presence of oxygen gas. In another example, selectively oxidizing may comprise a wet oxidation technique. However oxidizing is performed, oxidizing the second layers 140A, 140B of a fin 120 converts the portions 155 into oxides, e.g., (in the case of the second material being SiGe) silicon oxide with some according volume expansion.

Figure 1C:
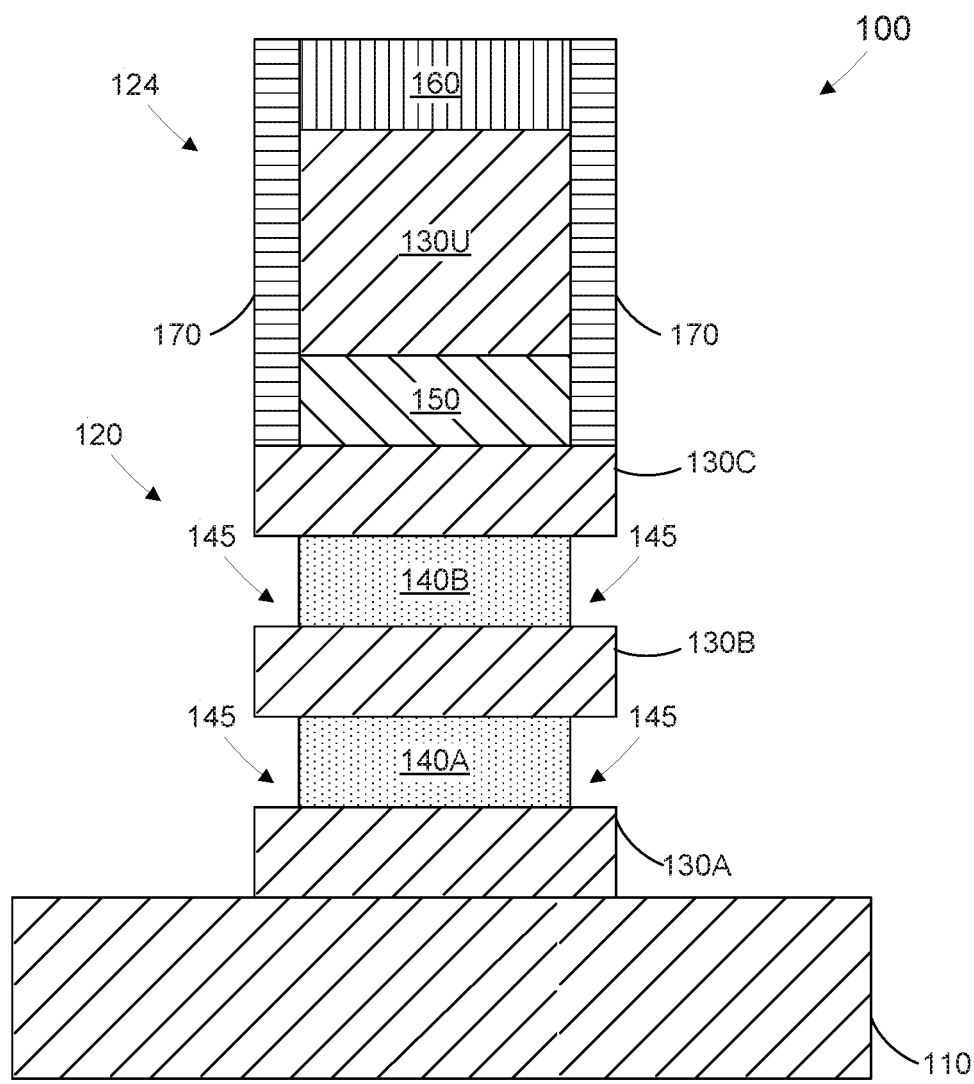
FIG. 1C illustrates a stylized cross-sectional depiction of the semiconductor device of FIGS. 1A-1B after a third stage of processing in accordance with embodiments herein.

FIG. 1C depicts semiconductor structure 100 after selectively stripping the two oxidized portions 155 of each of the second layers 140, to yield a plurality of second layer recesses 145. Any selective stripping technique known in the art may be used, provided it is sufficiently selective to the first layers 130A, 130B, 130C and first spacer material 170, as well as any of oxide layer 150, first material region 130U, and/or nitride layer 160 that may be present in dummy gate structure 124.

Figure 1D:
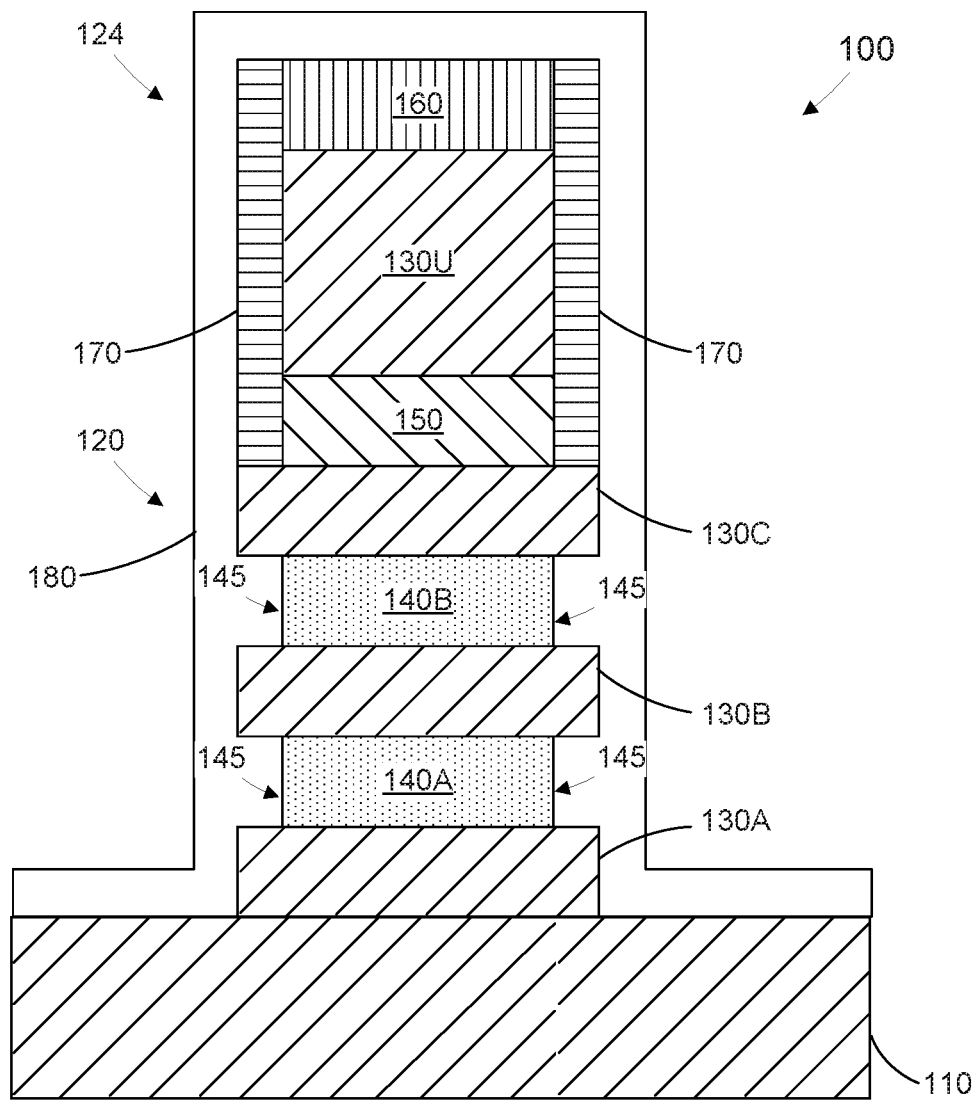
FIG. 1D illustrates a stylized cross-sectional depiction of the semiconductor device of FIGS. 1A-1C after a fourth stage of processing in accordance with embodiments herein.

Referring to FIG. 1D, the semiconductor structure 100 is shown after depositing a second spacer material 180 on at least the sidewalls of the fins 120, and in the depicted embodiment, on the dummy gate structures 124 as well, wherein the second spacer material 180 fills the plurality of second layer recesses 145. The second spacer material 180 may be deposited by any appropriate technique, such as atomic layer deposition (ALD).

The second spacer material 180 may be a low-k dielectric or a silicon nitride. The second spacer material 180 may be the same as the first spacer material 170 or may be different, and may be selected based on various considerations discussed in more detail below.

Figure 1E:
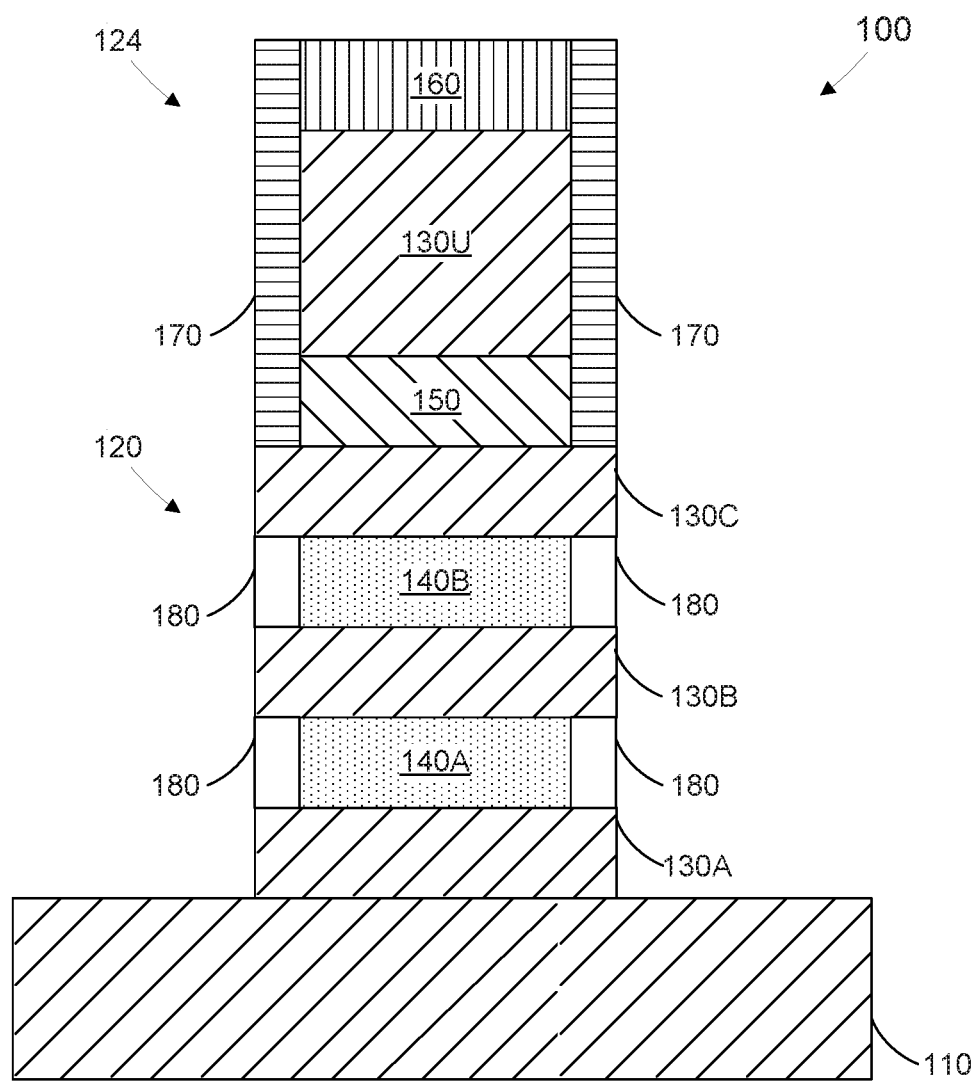
FIG. 1E illustrates a stylized cross-sectional depiction of the semiconductor device of FIGS. 1A-1D after a fifth stage of processing in accordance with embodiments herein.

In the embodiment shown in FIG. 1D, the second spacer material 180 is shown covering the entirety of the sidewalls of the fin 120 and the dummy gate structure 124, along with the top of the dummy gate structure 124 and the surface of semiconductor substrate 110. In embodiments such as the depicted one, wherein the second spacer material 180 is deposited in locations in addition to the second layer recesses 145, the second spacer material 180 may be etched back to yield the structure depicted in FIG. 1E. Specifically, the second spacer material 180 may be etched back from at least the portions of the first layers 130A, 130B, 120C exposed on the sidewalls of the fin 120. The second spacer material 180 may also be etched back from first spacer material 170 and/or nitride layer 160.

Any etching technique known in the art may be used for etching back the second spacer material 180 from at least the portions of the first layers 130A, 130B, 120C exposed on the sidewalls of the fin 120. If the first spacer material 170 and the second spacer material 180 are the same material, then etching process parameters may be selected to retain at least some of first spacer material 170 on the sidewalls of the dummy gate structure 124. If the first spacer material 170 and the second spacer material 180 are different materials, then an etch selective to the first spacer material 170 may be performed.

Figure 1F:
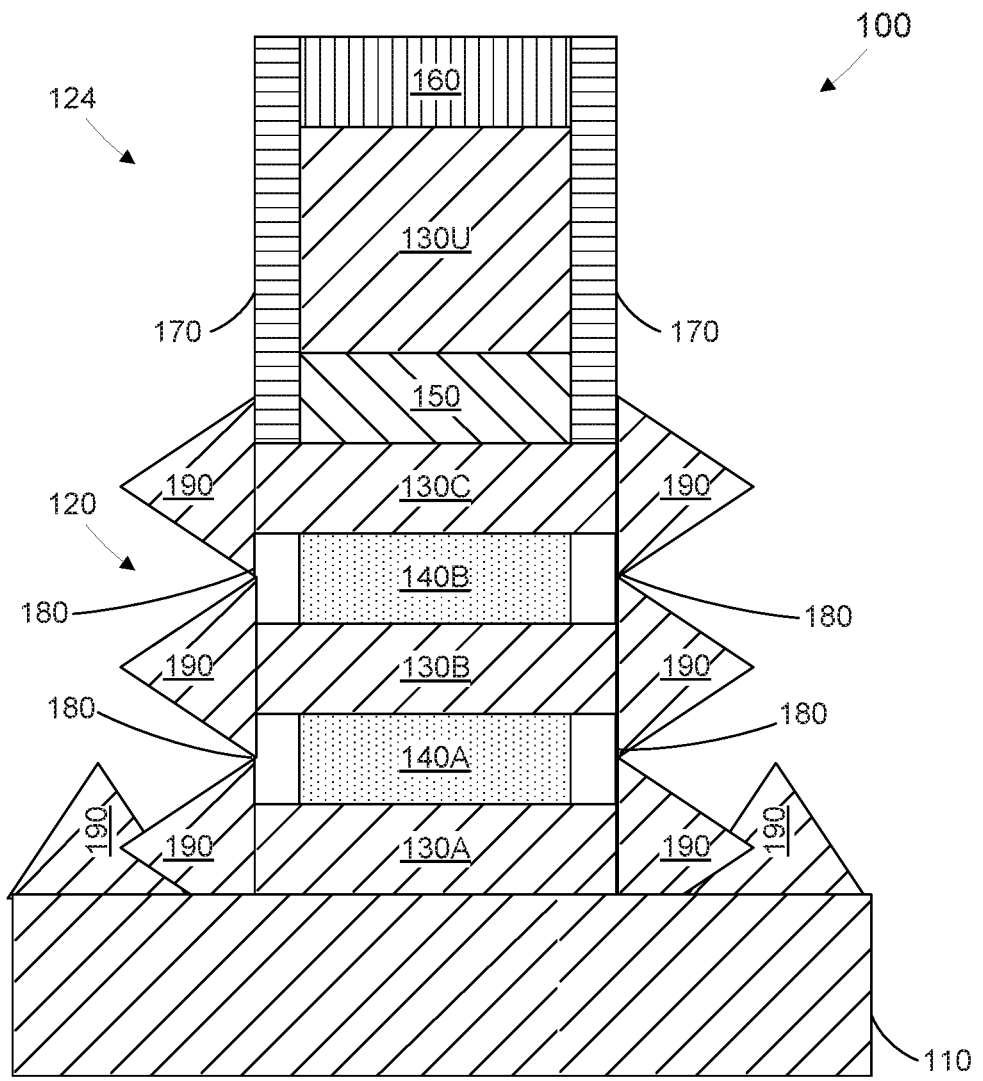
FIG. 1F illustrates a stylized cross-sectional depiction of the semiconductor device of FIGS. 1A-1E after a sixth stage of processing in accordance with embodiments herein.

Turning to FIG. 1F, the semiconductor structure 100 is depicted after epitaxially growing a source/drain material 190 from at least portions of the first layers 130A, 130B, and 130C exposed on the sidewalls of the fin 120. In the depicted embodiment, the source/drain material 190 is further epitaxially grown from the semiconductor substrate 110. Techniques for epitaxial growth are known to the person of ordinary skill in the art and can be routinely implemented upon having the benefit of the present disclosure. The process parameters of the epitaxial growth, such as the duration of growth, may be selected such that the epitaxially grown source/drain material 190 may merge. In other embodiments, the epitaxially grown source/drain material 190 may not be merged.

The semiconductor structure 100 depicted in FIG. 1F may then undergo additional, known processing steps to form various desired semiconductor devices. For example, in one embodiment, (not shown), the semiconductor structure 100 may undergo replacement of one or more of the second layers 140A, 140B with a gate.

Figure 2A:
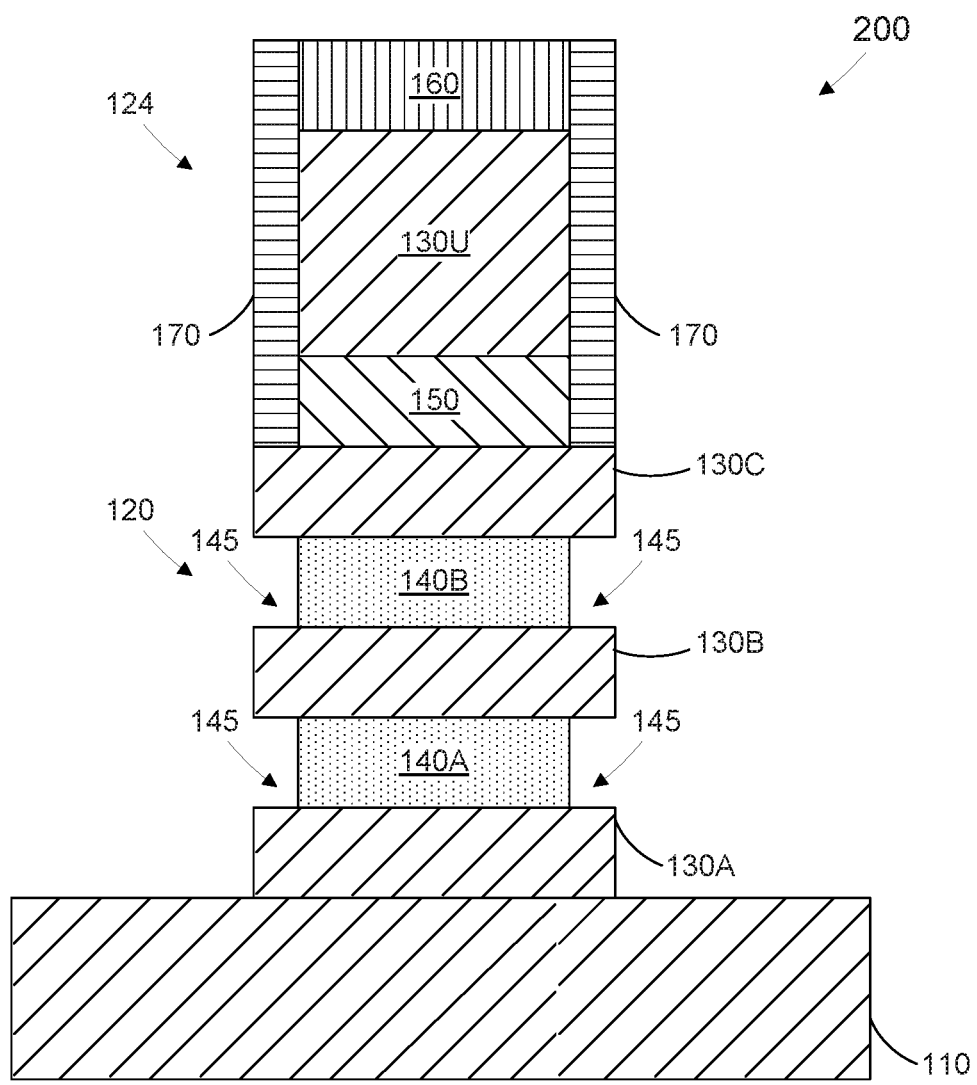
FIG. 2A illustrates a stylized cross-sectional depiction of a semiconductor device after a first stage of processing in accordance with embodiments herein.

Turning now to FIG. 2A, a second embodiment of a semiconductor structure, generally indicated as 200, is depicted. Throughout FIGS. 2A-2E, numerous depicted elements may be comparable to elements set forth in FIGS. 1A-1F and the accompanying discussion of those figures, above. Such comparable elements will be indicated in FIGS. 2A-2E with reference numerals having the same final two digits (and letter suffix, if any) as the corresponding reference numeral in FIGS. 1A-1F. The comparable elements in FIGS. 2A-2E will have a first digit of "2," compared to a first digit of "1" in FIGS. 1A-1F. For the sake of brevity, such comparable elements will not be described in detail below. The description of FIGS. 2A-2E will focus on differences relative to FIGS. 1A-1F.

FIG. 2A shows the semiconductor structure 200 comprising a plurality of second layer recesses 145, which may be produced by any known technique, such as those described above as leading to the semiconductor structure 100 shown in FIG. 1C. In one embodiment, each of the first layers 130A, 130B, and 130C may comprise silicon and each of the second layers 140A, 140B may comprise silicon/germanium (SiGe). If the second material is SiGe, it may have the germanium mole percentages described above. In one embodiment, the first spacer material 170 may comprise a low-k dielectric material.

Figure 2B:
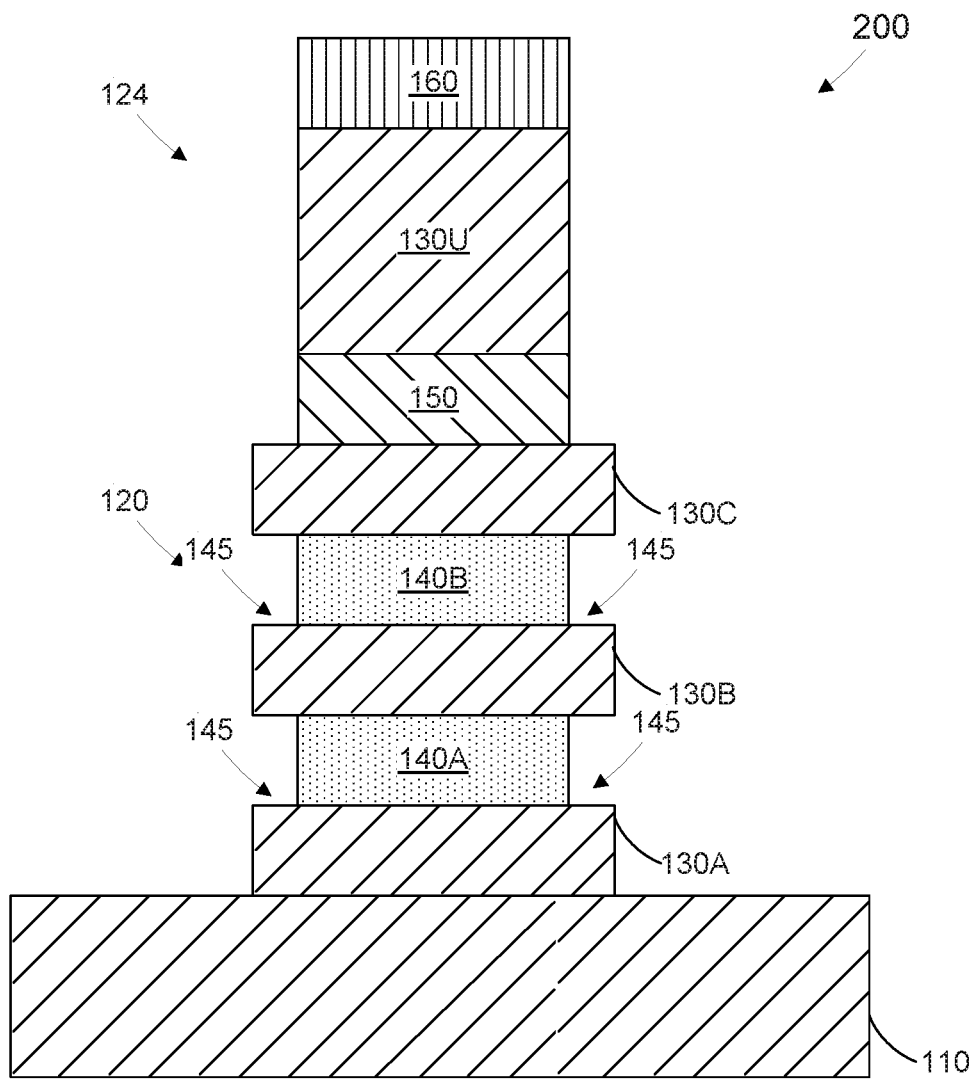
FIG. 2B illustrates a stylized cross-sectional depiction of the semiconductor device of FIG. 2A after a second stage of processing in accordance with embodiments herein.

FIG. 2B depicts the semiconductor structure 200 after removal of the first spacer material 170 from the dummy gate structure 124. The first spacer material 170 may be removed by any appropriate technique, such as stripping of oxide or low-k dielectric selective to nitride or vice versa.

Figure 2C:
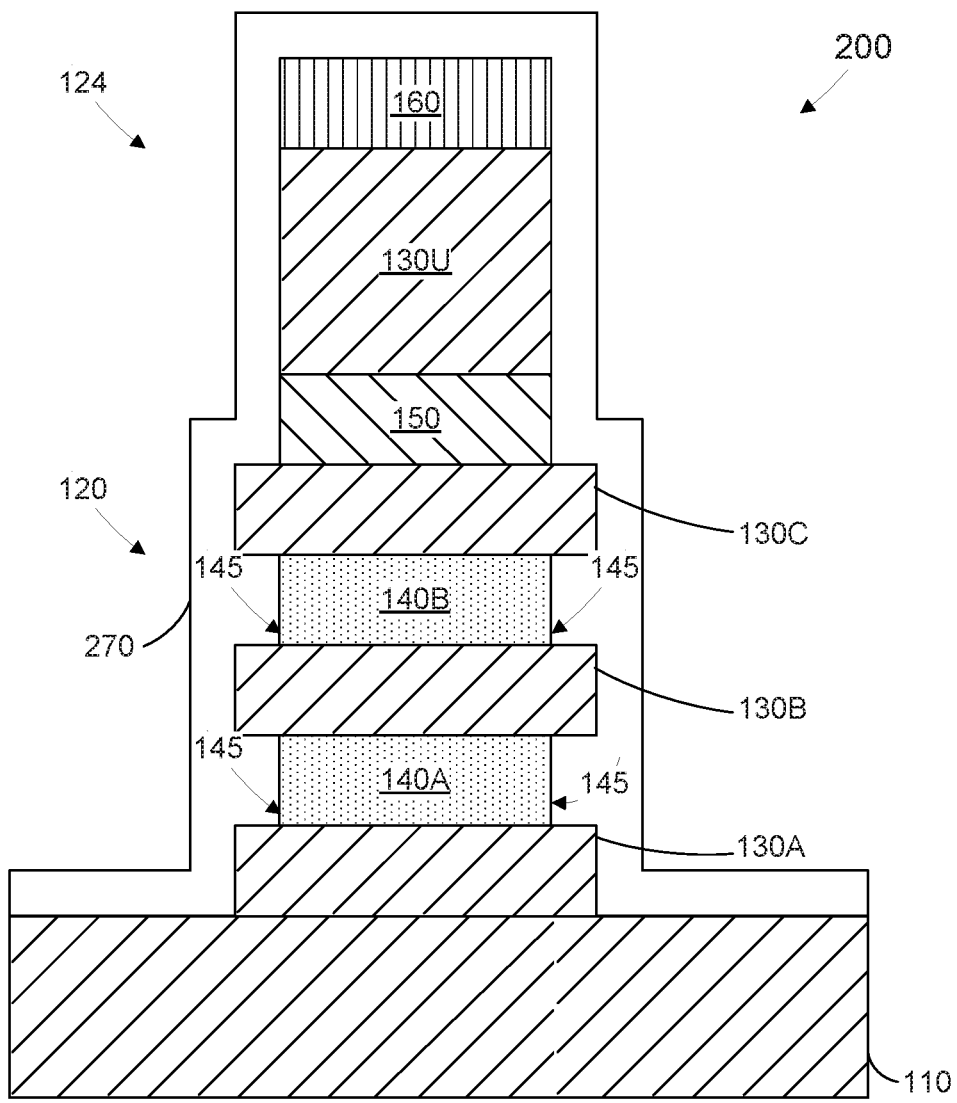
FIG. 2C illustrates a stylized cross-sectional depiction of the semiconductor device of FIGS. 2A-2B after a third stage of processing in accordance with embodiments herein.

FIG. 2C depicts the semiconductor structure 200 after deposition of a second spacer material 270 on at least the sidewalls of the fin 120, wherein the second spacer material 270 fills the plurality of second layer recesses 145. The second spacer material 270 may be a low-k dielectric material. The second spacer material 270 may be the same or may be different from the first spacer material 170. The second spacer material 270 may be deposited by ALD.

Figure 2D:
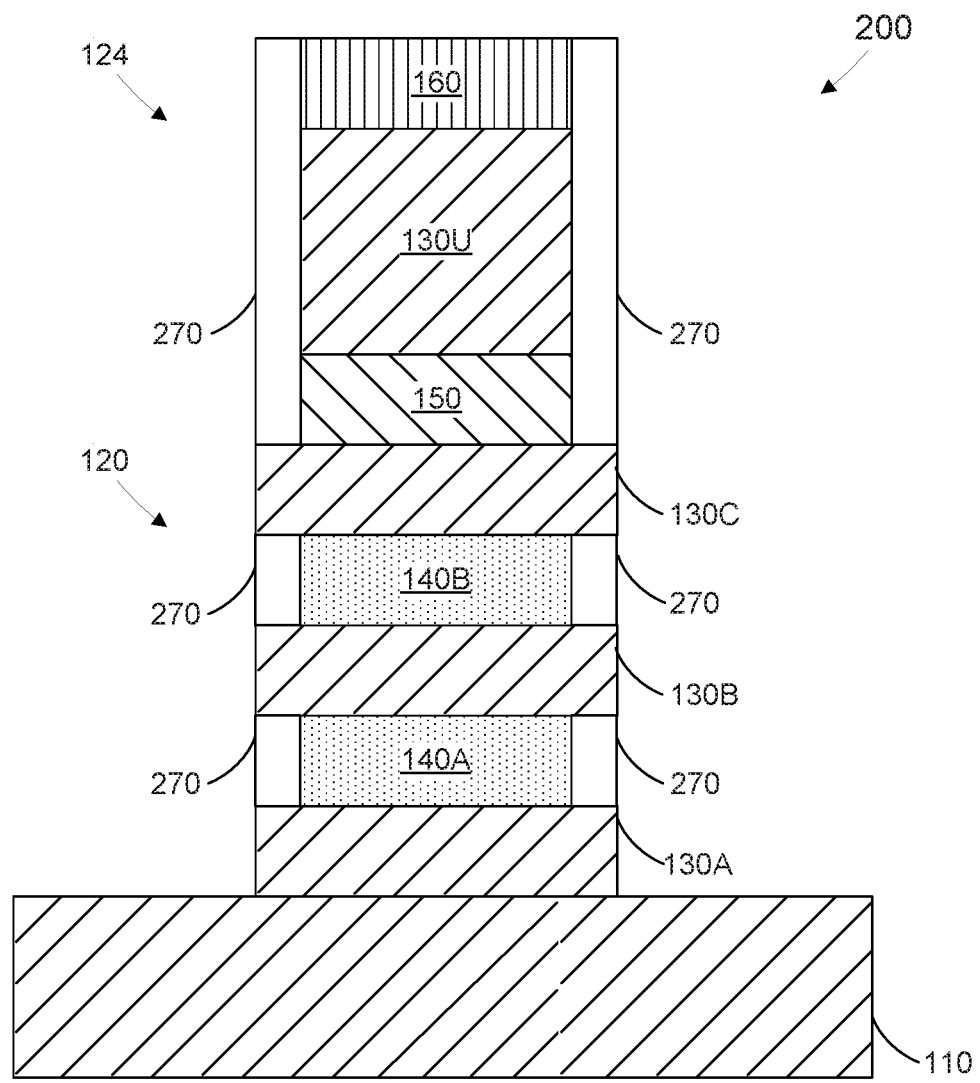
FIG. 2D illustrates a stylized cross-sectional depiction of the semiconductor device of FIGS. 2A-2C after a fourth stage of processing in accordance with embodiments herein.

Turning to FIG. 2D, the semiconductor structure 200 is shown after etching back the second spacer material 270 from at least portions of each of the first layers 130A, 130B, 130C extending laterally beyond the plurality of second layer recesses 145, thereby exposing the portions of each of the first layers 130A, 130B, 130C on the sidewalls of the fin 120. Any etching technique known in the art may be used. Desirably, second spacer material 270 is retained not only in recesses 145 adjacent to the remaining portions of the second layers 140A, 140B, but also on the sidewalls of the dummy gate structure 124. In this case, an anisotropic etchback process may be desirable.

Figure 2E:
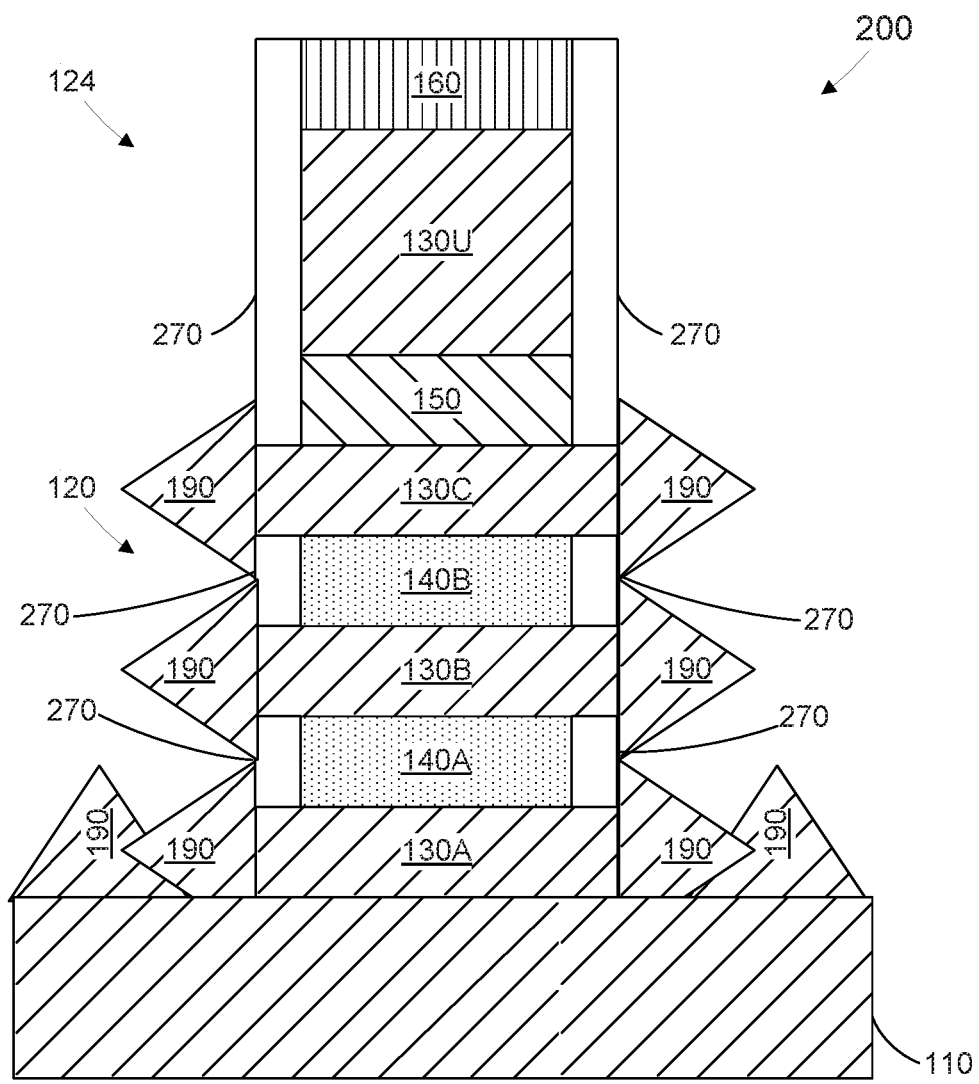
FIG. 2E illustrates a stylized cross-sectional depiction of the semiconductor device of FIGS. 2A-2D after a fifth stage of processing in accordance with embodiments herein.

Finally, FIG. 2E depicts the semiconductor structure 200 after epitaxial growth of the source/drain material 190 from at least the portions of the first layers 130A, 130B, 130C exposed on the sidewalls of the fin 120. Thereafter, the semiconductor structure 200 may undergo additional processing, such as replacing one or more of the second layers 140A, 140B with a gate, to yield a semiconductor device (not shown).

Regardless of how a semiconductor structure 100, 200 is made, a method of the present invention may produce a semiconductor structure, comprising a semiconductor substrate; at least one fin, wherein the at least one fin comprises one or more first layers and one or more second layers, wherein the first layers and the second layers are interspersed and the first layers laterally extend further than the second layers; a dummy gate structure comprising a first spacer material disposed on sidewalls of the dummy gate; a second spacer material disposed adjacent to each of the second layers, wherein sidewalls of the fin comprise exposed portions of each of the first layers and the second spacer material, and an epitaxial source/drain material disposed on at least the exposed portions of each of the first layers.

Figure 3:
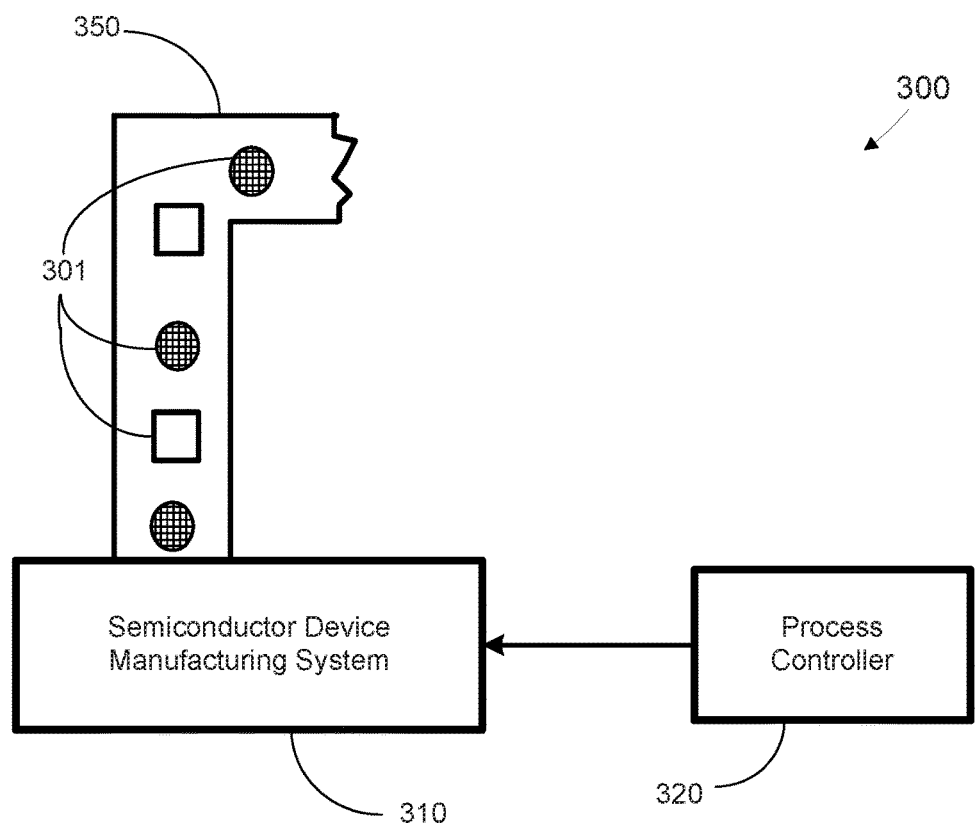
FIG. 3 illustrates a semiconductor device manufacturing system for manufacturing a device in accordance with embodiments herein.

Turning now to FIG. 3, a stylized depiction of a system for fabricating a semiconductor device 100, in accordance with embodiments herein, is illustrated. The system 300 of FIG. 3 may comprise a semiconductor device manufacturing system 310 and a process controller 320. The semiconductor device manufacturing system 310 may manufacture semiconductor devices based upon one or more instruction sets provided by the process controller 320. In one embodiment, a first instruction set may comprise instructions to provide a semiconductor structure comprising a semiconductor substrate; at least one fin comprising one or more first layers and one or more second layers, wherein the first layers and the second layers are interspersed and each of the second layers is more susceptible to oxidation than any of the first layers; and a dummy gate structure comprising a first spacer material disposed on sidewalls of the dummy gate; selectively oxidize two portions of each of the second layers, wherein the two portions are exposed on the sidewalls of the fin; selectively strip the two portions of each of the second layers, to yield a plurality of second layer recesses; deposit a second spacer material on at least the sidewalls of the fin, wherein the second spacer material fills the plurality of second layer recesses; and epitaxially grow a source/drain material from at least portions of each of the first layers exposed on the sidewalls of the fin. The first instruction set may further comprise instructions to etch back the second spacer material from at least the portions of the first layers exposed on the sidewalls of the fin. The first instruction set may further comprise instructions to epitaxially grow the first material further comprises growing the first material from the semiconductor substrate. The first instruction set may further comprise instructions to replace one or more of the second layers with a gate.

In one embodiment, a second instruction set may comprise instructions to provide a semiconductor structure comprising a semiconductor substrate; at least one fin comprising one or more first layers and one or more second layers, wherein the first layers and the second layers are interspersed and each second layer comprises two recesses along sidewalls of the fin; and a dummy gate structure comprising first spacer material disposed on the sidewalls of the dummy gate; remove the first spacer material; deposit a second spacer material on at least the sidewalls of the fins, wherein the second spacer material fills the plurality of second layer recesses; etch back the second spacer material from at least portions of each of the first layers extending laterally beyond the plurality of second layer recesses, thereby exposing the portions of each of the first layers on the sidewalls of the fin; and epitaxially grow a source/drain material from at least the portions of the first layers exposed on the sidewalls of the fin. The second instruction set may further comprise instructions to epitaxially grow the first material further comprises growing the first material from the semiconductor substrate. The second instruction set may further comprise instructions to replace one or more of the second layers with a gate.

The semiconductor device manufacturing system 310 may comprise various processing stations, such as etch process stations, photolithography process stations, CMP process stations, etc. One or more of the processing steps performed by the semiconductor device manufacturing system 310 may be controlled by the process controller 320. The process controller 320 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device manufacturing system 310 may produce semiconductor devices 301 (e.g., integrated circuits) on a medium, such as silicon wafers. The semiconductor device manufacturing system 310 may provide processed semiconductor devices 301 on a transport mechanism 350, such as a conveyor system. In some embodiments, the conveyor system may be sophisticated clean room transport systems that are capable of transporting semiconductor wafers. In one embodiment, the semiconductor device manufacturing system 310 may comprise a plurality of processing steps, e.g., the $1^{st}$ process step, the $2^{nd}$ process step, etc.

In some embodiments, the items labeled "301" may represent individual wafers, and in other embodiments, the items 301 may represent a group of semiconductor wafers, e.g., a "lot" of semiconductor wafers. The semiconductor device 301 may comprise one or more of a transistor, a capacitor, a resistor, a memory cell, a processor, and/or the like.

The system 300 may be capable of manufacturing various products involving various technologies. For example, the system 300 may produce devices of CMOS technology, Flash technology, BiCMOS technology, power devices, memory devices (e.g., DRAM devices), NAND memory devices, and/or various other semiconductor technologies.

Figure 4:
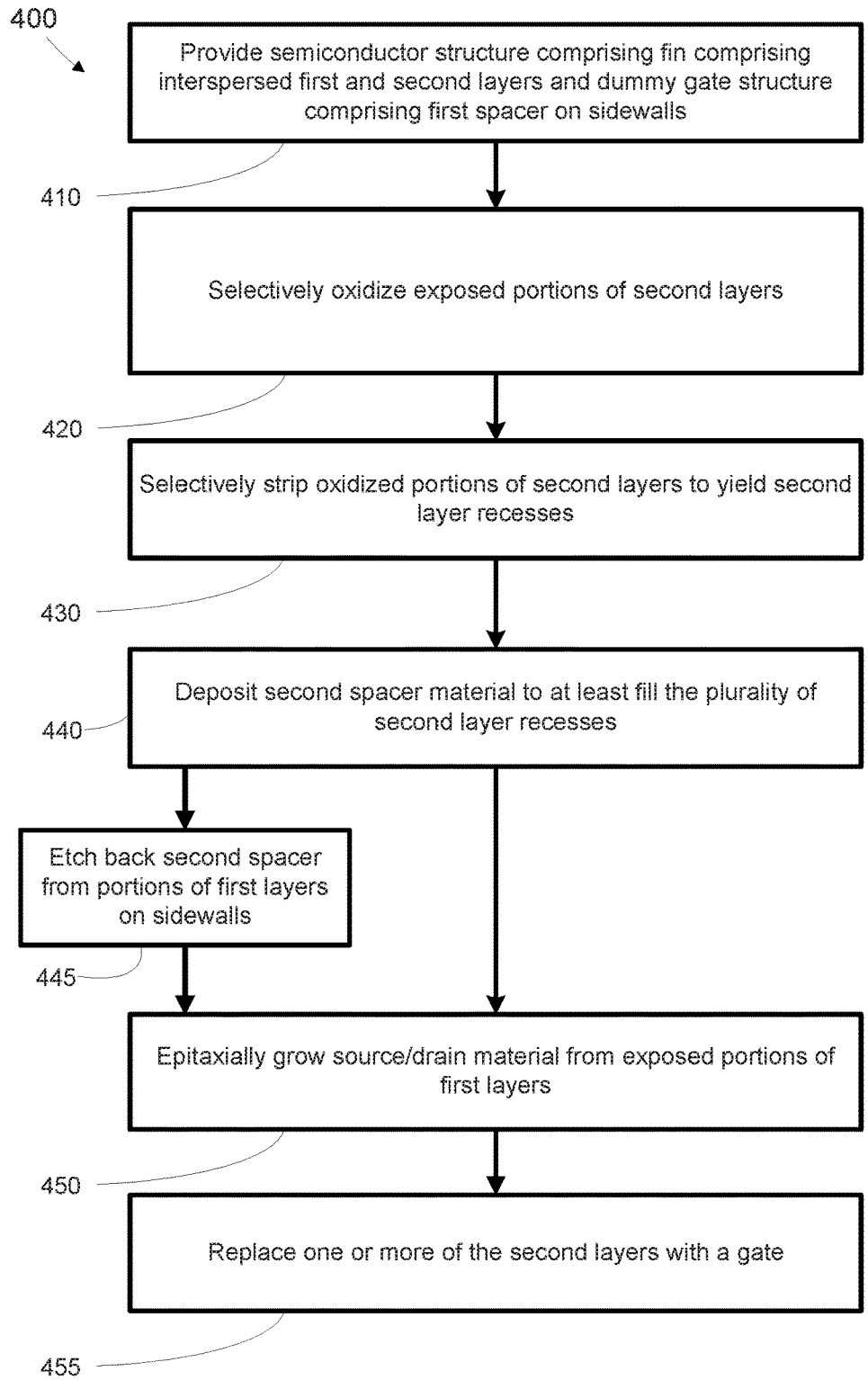
FIG. 4 illustrates a flowchart of a method in accordance with embodiments herein.

Turning to FIG. 4, a flowchart of a method 400 in accordance with embodiments herein is depicted. The method 400 comprises providing (at 410) a semiconductor structure 100 comprising a semiconductor substrate 110; at least one fin 120 comprising one or more first layers 130A, 130B, 130C and one or more second layers 140A, 140B, wherein the first layers 130A, 130B, 130C and the second layers 140A, 140B are interspersed and each of the second layers is more susceptible to oxidation than any of the first layers; and a dummy gate structure 124 comprising first spacer material 170 disposed on sidewalls of the fin 120. In one embodiment, the first material may be silicon and the second material may be silicon/germanium (SiGe). In one embodiment, the first spacer material 170 may comprise a low-k dielectric material.

The method 400 may further comprise selectively oxidizing (at 420) two portions of each of the second layers 140A, 140B, wherein the two portions are exposed on the sidewalls of the fin 120. The two portions of each of the second layers 140A, 140B may be selectively stripped (at 430) to yield a plurality of second layer recesses 145.

The method 400 may comprise depositing (at 440) a second spacer material 180 on at least the sidewalls of the fin 120, wherein the second spacer material 180 fills the plurality of second layer recesses 145. The second spacer material 180 may be a low-k dielectric or a nitride, such as silicon nitride. In one embodiment, the second spacer material differs from the first spacer material. Thereafter, in one embodiment, the method 400 may comprise etching back (at 445) the second spacer material 180 from at least the portions of the first layers 130A, 130B, 130C exposed on the sidewalls of the fin 120. In other embodiments, etching back (at 445) may not be required and may be omitted.

The method 400 may then comprise epitaxially growing (at 450) a source/drain material 190 from at least portions of the first layers 130A, 130B, 130C exposed on the sidewalls of the fin 120. Epitaxially growing (at 450) may further comprise growing the source/drain material 190 from the semiconductor substrate 110.

The semiconductor structure produced by elements 410-450 may be used in subsequent steps of method 400 or other methods. In one embodiment, the method 400 may further comprise replacing (at 455) one or more of the second layers with a gate.

Figure 5:
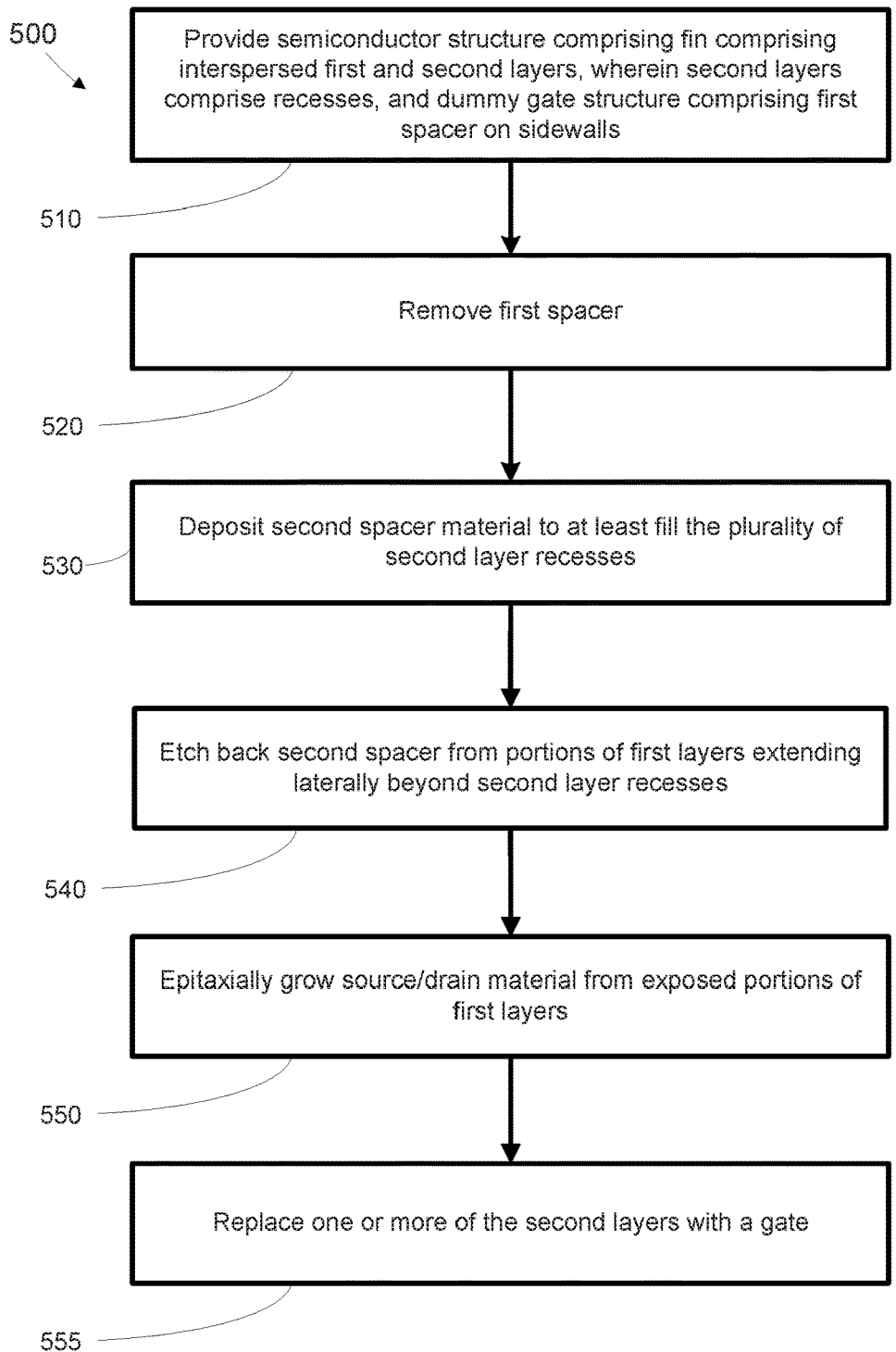
FIG. 5 illustrates a flowchart of a method in accordance with embodiments herein.

Turning to FIG. 5, a flowchart of a method 500 in accordance with embodiments herein is depicted. The method 500 comprises providing (at 500) a semiconductor structure 200 comprising a semiconductor substrate 110 and at least one fin 120 comprising one or more first layers 130A, 130B, 130C and one or more second layers 140A, 140B, wherein the first layers and the second layers are interspersed and each second layer 140A, 140B comprises two recesses 145 along sidewalls of the fin 120, and a dummy gate structure comprising first spacer material 170 disposed on the sidewalls of the dummy gate. In one embodiment, the first material may be silicon and the second material may be silicon/germanium (SiGe). In one embodiment, the first spacer material 170 may comprise a low-k dielectric material. In one embodiment, providing (at 500) may comprise the providing (at 410), selectively oxidizing (at 420) and selectively stripping (at 430) elements of method 400 described above.

Regardless how the semiconductor structure 200 is provided (at 510), the method 500 may further comprise removing (at 520) the first spacer material 170, which may be followed by depositing (at 530) a second spacer material 270 on at least the sidewalls of the fins 120, wherein the second spacer material 270 fills the plurality of second layer recesses 145. The second spacer material 270 may be a low-k dielectric or a nitride, such as silicon nitride. In one embodiment, the second spacer material 270 differs from the first spacer material 170.

The method 500 may also comprise etching back (at 540) the second spacer material 270 from at least portions of each of the first layers 130A, 130B, 130C extending laterally beyond the plurality of second layer recesses 145, thereby exposing the portions of each of the first layers 130A, 130B, 130C on the sidewalls of the fin 120.

In addition, the method 500 may comprise epitaxially growing (at 550) a source/drain material 190 from at least the portions of the first layers 130A, 130B, 130C exposed on the sidewalls of the fin 120. Epitaxially growing (at 550) may further comprise growing the source/drain material 190 from the semiconductor substrate 110.

The semiconductor structure produced by elements 510-550 may be used in subsequent steps of method 500 or other methods. In one embodiment, the method 500 may further comprise replacing (at 555) one or more of the second layers with a gate.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:
1. A semiconductor structure, comprising:
   a semiconductor substrate;
   at least one fin, wherein the at least one fin comprises one or more first layers comprising a first material and one or more second layers comprising a second material, wherein the first layers and the second layers are interspersed and the first layers laterally extend further than the second layers;
a dummy gate structure comprising a first spacer material disposed on sidewalls of the dummy gate;
a second spacer material disposed adjacent to each of the second layers, wherein sidewalls of the fin comprise exposed portions of each of the first layers and the second spacer material, and the second spacer material differs from the first spacer material; and
an epitaxial source/drain material disposed on at least the exposed portions of each of the first layers.

2. The semiconductor structure of claim 1, wherein the second material is more susceptible to oxidation than the first material.

3. The semiconductor structure of claim 1, wherein the first material is silicon and the second material is silicon/germanium (SiGe).

4. The semiconductor structure of claim 1, wherein the first spacer material comprises a low-k dielectric material.

5. The semiconductor structure of claim 1, wherein the epitaxial source/drain material is further disposed on the semiconductor substrate.

6. A semiconductor structure, comprising:
a semiconductor substrate;
at least one fin, wherein the at least one fin comprises one or more first layers comprising silicon and one or more second layers comprising silicon germanium having a formula $Si_xGe_{1-x}$, wherein $0.1 \leq x \leq 0.5$, wherein the first layers and the second layers are interspersed and the first layers laterally extend further than the second layers;
a dummy gate structure comprising a first spacer material disposed on sidewalls of the dummy gate;
a second spacer material disposed adjacent to each of the second layers, wherein sidewalls of the fin comprise exposed portions of each of the first layers and the second spacer material and the second spacer material comprises a low-k dielectric material or silicon nitride, and
an epitaxial source/drain material disposed on at least the exposed portions of each of the first layers.

7. The semiconductor structure of claim 6, wherein $x \approx 0.5$.

8. The semiconductor structure of claim 6, wherein the first spacer material comprises a low-k dielectric material or silicon nitride.

9. The semiconductor structure of claim 6, wherein the epitaxial source/drain material is further disposed on the semiconductor substrate.

10. The semiconductor structure of claim 6, wherein the epitaxial source/drain material is merged.

11. A semiconductor structure, comprising:
a semiconductor substrate;
at least one fin, wherein the at least one fin comprises one or more first layers comprising silicon germanium having a formula $Si_xGe_{1-x}$ and one or more second layers comprising silicon germanium having a formula $Si_yGe_{1-y}$, wherein $y > x$, wherein the first layers and the second layers are interspersed and the first layers laterally extend further than the second layers;
a dummy gate structure comprising a first spacer material disposed on sidewalls of the dummy gate;
a second spacer material disposed adjacent to each of the second layers, wherein sidewalls of the fin comprise exposed portions of each of the first layers and the second spacer material and the second spacer material comprises a low-k dielectric material or silicon nitride, and
an epitaxial source/drain material disposed on at least the exposed portions of each of the first layers.

12. The semiconductor structure of claim 11, wherein the first spacer material comprises a low-k dielectric material or silicon nitride.

13. The semiconductor structure of claim 11, wherein the epitaxial source/drain material is further disposed on the semiconductor substrate.

14. The semiconductor structure of claim 11, wherein the epitaxial source/drain material is merged.

* * * * *